United States Patent
Inoue

(10) Patent No.: US 11,637,543 B2
(45) Date of Patent: Apr. 25, 2023

(54) ACOUSTIC WAVE DEVICE AND ACOUSTIC WAVE MODULE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 333 days.

(21) Appl. No.: 16/901,031

(22) Filed: Jun. 15, 2020

(65) Prior Publication Data

US 2020/0313647 A1 Oct. 1, 2020

Related U.S. Application Data

(63) Continuation of application No. PCT/JP2018/043504, filed on Nov. 27, 2018.

(30) Foreign Application Priority Data

Dec. 26, 2017 (JP) .............................. JP2017-249252

(51) Int. Cl.
*H03H 9/02* (2006.01)
*H03H 9/10* (2006.01)
*H03H 9/25* (2006.01)
*H03H 9/05* (2006.01)
*H03H 9/145* (2006.01)

(52) U.S. Cl.
CPC ........ *H03H 9/02913* (2013.01); *H03H 9/059* (2013.01); *H03H 9/1092* (2013.01); *H03H 9/145* (2013.01); *H03H 9/25* (2013.01)

(58) Field of Classification Search
CPC ................ H03H 9/02; H03H 9/05; H03H 9/15
See application file for complete search history.

(56) References Cited

U.S. PATENT DOCUMENTS 9,197,190 B2 * 11/2015 Yamashita ........... H03H 9/1092
9,548,437 B2 * 1/2017 Ohashi ................. H01L 41/047
9,876,158 B2 * 1/2018 Henn ..................... H05K 13/00
(Continued)

FOREIGN PATENT DOCUMENTS

JP  07-14651 U  3/1995
JP  H0714651 U * 3/1995
(Continued)

OTHER PUBLICATIONS

Official Communication issued in International Patent Application No. PCT/JP2018/043504, dated Feb. 19, 2019.

*Primary Examiner* — Hafizur Rahman
*Assistant Examiner* — Alan Wong
(74) *Attorney, Agent, or Firm* — Keating & Bennett, LLP

(57) ABSTRACT

An acoustic wave device includes a substrate, a functional element provided on the substrate, a cover layer provided on or above the substrate to cover the functional element, and a protection layer that covers the cover layer. The cover layer includes a curved portion that is curved to protrude outward. A hollow space is defined between the curved portion and the substrate, and the functional element is provided in the hollow space. The acoustic wave device also includes a conductive portion that is provided between the curved portion and the protection layer and extends along a surface of the curved portion.

14 Claims, 6 Drawing Sheets

(56) References Cited

U.S. PATENT DOCUMENTS

| | | | |
|---|---|---|---|
| 10,715,100 B2 * | 7/2020 | Na | ............... H01L 41/332 |
| 2012/0319802 A1 | 12/2012 | Ochiai et al. | |
| 2015/0380634 A1 | 12/2015 | Henn et al. | |
| 2016/0020749 A1 | 1/2016 | Henn et al. | |
| 2017/0179920 A1 | 6/2017 | Kawasaki | |
| 2017/0288627 A1 | 10/2017 | Takano et al. | |
| 2018/0159496 A1 * | 6/2018 | Na | ............... H01L 41/18 |

FOREIGN PATENT DOCUMENTS

| | | | |
|---|---|---|---|
| JP | 2000-236230 A | | 8/2000 |
| JP | 2007-324162 A | | 12/2007 |
| JP | 2008-227748 A | | 9/2008 |
| JP | 2008227748 A | * | 9/2008 |
| JP | 2012-109925 A | | 6/2012 |
| JP | 2014-222886 A | | 11/2014 |
| JP | 2016-066989 A | | 4/2016 |
| JP | 2016-515331 A | | 5/2016 |
| JP | 2016-516326 A | | 6/2016 |
| JP | 2017-118273 A | | 6/2017 |
| JP | 2017-196727 A | | 11/2017 |
| JP | 2018-117267 A | | 7/2018 |
| WO | 2011/087018 A1 | | 7/2011 |

* cited by examiner

ACOUSTIC WAVE DEVICE AND ACOUSTIC WAVE MODULE

CROSS REFERENCE TO RELATED APPLICATIONS

This application claims the benefit of priority to Japanese Patent Application No. 2017-249252 filed on Dec. 26, 2017 and is a Continuation Application of PCT Application No. PCT/JP2018/043504 filed on Nov. 27, 2018. The entire contents of each application are hereby incorporated herein by reference.

BACKGROUND OF THE INVENTION

1. Field of the Invention

The present invention relates to an acoustic wave device and an acoustic wave module and, more specifically, to the structure of an acoustic wave device that provides excellent shielding against electromagnetic waves.

2. Description of the Related Art

An acoustic wave device including a surface acoustic wave (SAW) resonator or a bulk acoustic wave (BAW) resonator finds use as a component of electronic apparatuses such as mobile phones and smart phones. With recent trends toward smaller, thinner electronic apparatuses, miniaturization and profile reduction are also required of the acoustic wave device. To address these requirements, a device proposed in Japanese Unexamined Patent Application Publication (Translation of PCT Application) No. 2016-515331 includes a carrier substrate, a functional structure provided on the carrier substrate, a thin-film cover that covers the functional structure, and a planarization layer that covers the thin-film cover.

Such a miniaturized, low-profile acoustic wave device is susceptible to extraneous electromagnetic waves. Furthermore, devices adjacent to the acoustic wave device are susceptible to electromagnetic waves from the acoustic wave device. As a workaround, the device proposed in Japanese Unexamined Patent Application Publication (Translation of PCT Application) No. 2016-515331 may also include a metallization layer provided on the planarization layer.

Electromagnetic waves radiated by the functional structure or entering the functional structure include not only electromagnetic waves propagating in the direction normal to the carrier substrate but also electromagnetic waves propagating in directions that form angles with the direction normal to the carrier substrate. The metallization layer proposed in Japanese Unexamined Patent Application Publication (Translation of PCT Application) No. 2016-515331 is provided on the planarization layer so as to be parallel to the carrier substrate. Due to limitations on area, the metallization layer may fail to provide sufficient shielding against electromagnetic waves propagating in directions that form angles with the direction normal to the carrier substrate.

SUMMARY OF THE INVENTION

Preferred embodiments of the present invention provide acoustic wave devices and acoustic wave modules that each provide excellent shielding against electromagnetic waves.

An acoustic wave device according to a preferred embodiment of the present invention includes a substrate, a functional element provided on the substrate, a cover layer provided on or above the substrate to cover the functional element, and a protection layer that covers the cover layer. The cover layer includes a curved portion that is curved to protrude outward. A hollow space is defined between the curved portion and the substrate. The functional element is provided in the hollow space. The acoustic wave device also includes a conductive portion that is provided between the curved portion and the protection layer and extends along a surface of the curved portion.

According to a preferred embodiment of the present invention, the acoustic wave device also includes a wiring that is provided on the substrate and is connected to the functional element. The conductive portion does not overlap the wiring when viewed in a direction normal or substantially normal to the substrate.

According to a preferred embodiment of the present invention, the cover layer also includes a flat or substantially flat portion extending along the substrate. The curved portion includes a lower curved portion whose height above the flat or substantially flat portion is less than about H/2; and an upper curved portion whose height above the flat or substantially flat portion is greater than about H/2, where H denotes the height of the curved portion at a point farther than any other point of the curved portion from the flat or substantially flat portion. The conductive portion includes a lower conductive portion provided between the lower curved portion and the protection layer and an upper conductive portion provided between the upper curved portion and the protection layer. The lower conductive portion has an areal density smaller than the areal density of the upper conductive portion.

According to a preferred embodiment of the present invention, the conductive portion has a mesh pattern, a pattern including a plurality of dots, a pattern including a plurality of strips, or a pattern including a plurality of dot-shaped holes. According to a preferred embodiment of the present invention, the conductive portion is ungrounded.

An acoustic wave module according to a preferred embodiment of the present invention includes a first acoustic wave device and a second acoustic wave device. Each of the first and second acoustic wave devices includes a substrate, a functional element provided on the substrate, a cover layer provided on or above the substrate to cover the functional element, and a protection layer that covers the cover layer. The cover layer includes a curved portion that is curved to protrude outward. A hollow space is defined between the curved portion and the substrate. The functional element is provided in the hollow space. The first acoustic wave device overlaps the second acoustic wave device in the direction normal or substantially normal to the substrate. The acoustic wave module also includes a conductive portion that is provided between the protection layer and at least one of the curved portion of the first acoustic wave device and the curved portion of the second acoustic wave device and extends along a surface of the curved portion.

According to preferred embodiments of the present invention, acoustic wave devices and acoustic wave modules each provide excellent shielding against electromagnetic waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
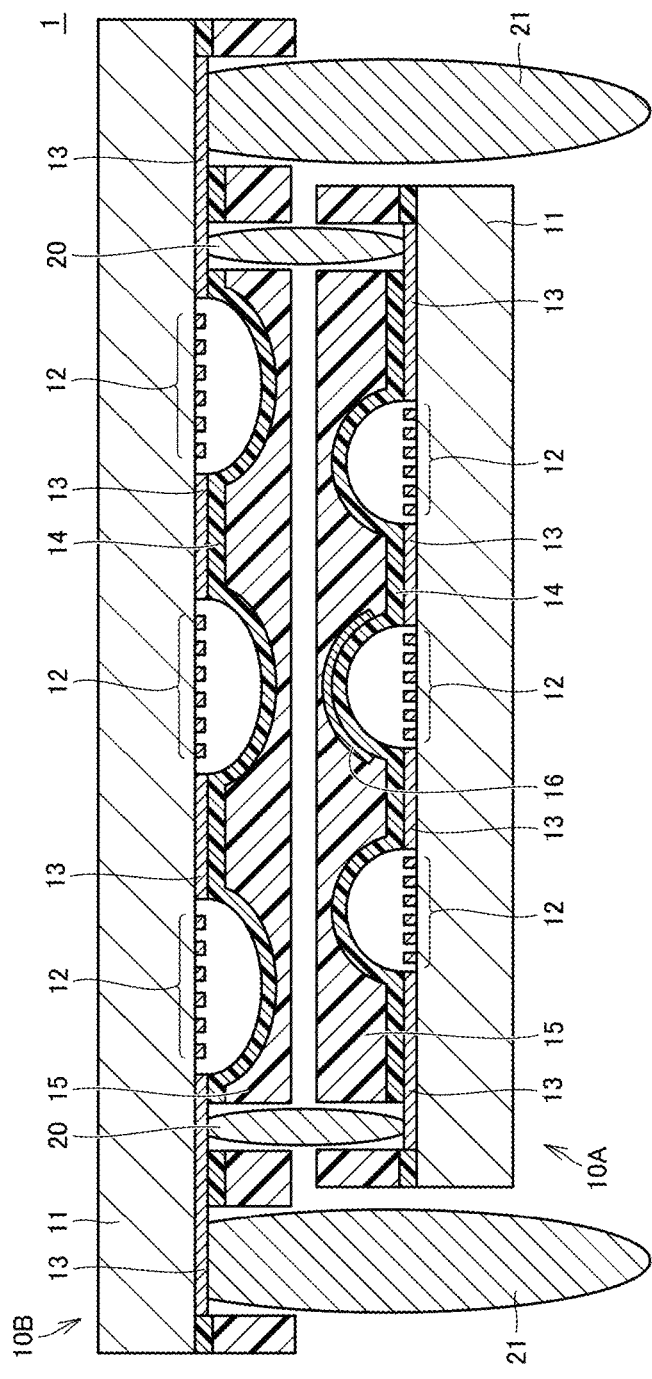
FIG. 1 is a sectional view of an acoustic wave module including two acoustic wave devices according to a preferred embodiment of the present invention.

Preferred embodiments of the present invention will be described below with reference to the drawings. Note that the same or similar portions in the drawings are denoted by the same reference signs throughout and a redundant description thereof will be omitted. The drawings are provided to facilitate the understanding of the preferred embodiments and are not necessarily accurate illustrations. For example, the dimension ratios of components shown in the drawings or the relative dimension ratios of the components may be inconsistent with the corresponding dimension ratio provided in the description. Some of the components described in the description may be omitted from a drawing, or one or some of the same components may be omitted from a drawing.

FIG. 1 is a sectional view of an acoustic wave module 1 including two acoustic wave devices according to the preferred embodiment, namely, acoustic wave devices 10A and 10B. Each of the acoustic wave devices 10A and 10B in the present preferred embodiment includes functional elements that are comb-shaped electrodes, namely, interdigital transducer (IDT) electrodes.

Referring to FIG. 1, each of the acoustic wave devices 10A and 10B includes a substrate 11, a plurality of functional elements 12, wiring 13, a cover layer 14, and a protection layer 15.

The substrate 11 is preferably made of, for example, a piezoelectric single-crystal material of any one of lithium tantalate ($LiTaO_3$), lithium niobate ($LiNbO_3$), alumina, silicon (Si), sapphire, or a piezoelectric laminated material including $LiTaO_3$ or $LiNbO_3$.

The functional elements 12 are provided on the substrate 11. Each functional element 12 includes a pair of IDT electrodes preferably made of an electrode material, for example, a single metal including at least one metal selected from aluminum, copper, silver, gold, titanium, tungsten, platinum, chromium, nickel, and molybdenum, or an alloy including these as a main component. The substrate 11, which is piezoelectric, and the IDT electrodes define a surface acoustic wave resonator. The wiring 13 is provided on the substrate 11 and is electrically connected to the functional elements 12.

The cover layer 14 is preferably made of, for example, a resin film or an inorganic membrane, is provided on or above the substrate 11 and covers the functional elements 12. The protection layer 15 is preferably made of, for example, insulating resin such as epoxy resin, and covers the cover layer 14.

The cover layer 14 and the protection layer 15 include through-holes, which are provided on a portion of the wiring 13. The wiring 13 is exposed through the through-holes. Connection terminals 20 and connection terminals 21 are received in the through-holes. Each connection terminal 20 provides a connection between the wiring 13 of the acoustic wave device 10A and the wiring 13 of the acoustic wave device 10B. Each connection terminal 21 provides a connection between the wiring 13 of the acoustic wave device 10B and a device external to the acoustic wave module 1.

The acoustic wave device 10B overlaps the acoustic wave device 10A in the direction normal or substantially normal to the substrate 11. The respective protection layers 15 of the acoustic wave devices 10A and 10B face each other. As shown in FIG. 1, the functional element 12 in the center or approximate center of the acoustic wave device 10A and the functional element 12 in the center or approximate center of the acoustic wave device 10B overlap each other when viewed in the direction normal or substantially normal to the substrate 11. The acoustic wave device 10A includes a conductive portion 16, and the functional element 12 in the center or approximate center of the acoustic wave device 10A is less prone to be affected by electromagnetic waves from the functional elements 12 of the acoustic wave device 10B (the functional element 12 in the center or approximate of the acoustic wave device 10B in particular). The conductive portion 16 also provides a shielding effect that eliminates or reduces the possibility that electromagnetic waves radiated by the functional element 12 in the center or approximate center of the acoustic wave device 10A will reach the functional elements 12 of the acoustic wave device 10B (the functional element 12 in the center or approximate center of the acoustic wave device 10B in particular).

Figure 2:
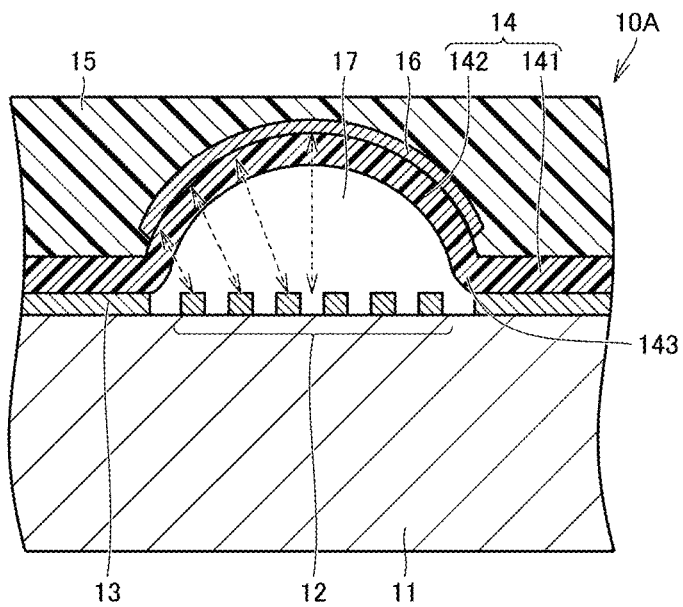
FIG. 2 is an enlarged view of a region including a conductive portion of the acoustic wave device in FIG. 1.

FIG. 2 is an enlarged view of a region including the conductive portion 16. As shown in FIG. 2, the cover layer 14 includes a flat or substantially flat portion 141, which extends along a surface of the substrate 11; and a curved portion 142, which is curved to protrude outward away from the substrate 11. A hollow space 17 is defined between the curved portion 142 and the substrate 11. The functional element 12 is provided in the hollow space 17. The curved portion 142 may has a dome shape, for example.

The curved portion 142 is curved to protrude outward, and the hollow space 17 is defined between the curved portion 142 and the substrate 11. Specifically, the height of the curved portion 142 above the flat or substantially flat portion 141 may increase substantially constantly or stepwise in a direction from a boundary portion 143, which is the boundary between the curved portion 142 and the flat or substantially flat portion 141, to the center of the curved portion 142. Alternatively, the height may increase macroscopically while microscopically alternately increasing and decreasing. The midsection of the curved portion 142 viewed in plan may be parallel or substantially parallel to the substrate 11. A portion of the curved portion 142 (e.g., the midsection of the curved portion 142 viewed in plan) may be recessed toward the substrate 11 to the extent where the contact with the substrate 11 and the functional element 12 is avoided.

The cover layer 14 is formed, for example, by the method described in Japanese Unexamined Patent Application Publication (Translation of PCT Application) No. 2016-515331. Specifically, the functional elements 12 on the substrate 11 are overlaid with a sacrificial layer, and the substrate 11 and the sacrificial layer are then coated with, for example, resin, which is in turn formed into the cover layer 14. A portion of the cover layer 14 provided on the substrate 11 or the wiring 13 is the flat or substantially flat portion 141, and a portion of the cover layer 14 provided on the sacrificial layer is the curved portion 142. The sacrificial layer is then removed from a hole of the curved portion 142, and the hollow space 17 between the curved portion 142 and the substrate 11 is provided accordingly.

The conductive portion 16 is provided between the curved portion 142 and the protection layer 15 and extends along a surface of the curved portion 142. For example, photolithography is used to form the conductive portion 16 on the surface of the curved portion 142. The conductive portion 16 has a solid pattern. The conductive portion 16 is preferably made of an electrode material, for example, a single metal including at least one metal selected from aluminum, copper, silver, gold, titanium, tungsten, platinum, chromium, nickel, and molybdenum, or an alloy including these as a main component.

The functional element 12 provided in the hollow space 17 radiates electromagnetic waves to the outside and is affected by extraneous electromagnetic waves. As denoted by dotted arrows in FIG. 1, electromagnetic waves radiated by the functional element or entering the functional element 12 include not only electromagnetic waves propagating in the direction normal or substantially normal to the substrate 11 but also electromagnetic waves propagating in directions that define angles with the direction normal or substantially normal to the substrate 11. Electromagnetic waves radiated by the functional element 12 are able to propagate radially. The conductive portion 16 extends along the surface of the curved portion 142. The conductive portion 16 thus provides shielding against not only electromagnetic waves propagating in the direction normal or substantially normal to the substrate 11 but also electromagnetic waves propagating in directions that define angles with the direction normal or substantially normal to the substrate 11.

Figure 3:
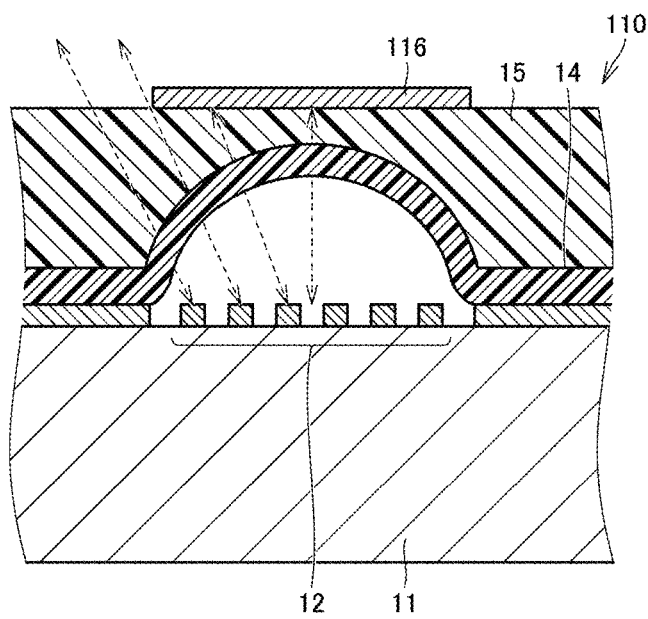
FIG. 3 is a sectional view of an acoustic wave device presented as a reference example and including a flat or substantially flat conductive portion provided on an upper surface of a protection layer.

FIG. 3 is a sectional view of an acoustic wave device presented as a reference example and including a conductive portion 116, which is a flat or substantially flat conduction portion provided on an upper surface of the protection layer 15. As with the conductive portion 16 in FIG. 2, the conductive portion 116 is provided above the functional element 12. As shown in FIG. 3, the conductive portion 116, which is flat or substantially flat, provides shielding against electromagnetic waves radiated by the functional element 12 or entering the functional element 12 that propagate in the direction normal or substantially normal to the substrate 11. However, shielding against electromagnetic waves propagating in directions that define angles with the direction normal or substantially normal to the substrate 11 may be insufficient. The size of the conductive portion 116 may be increased in the planar direction to provide shielding against electromagnetic waves propagating in directions that define angles with the direction normal or substantially normal to the substrate 11. However, this involves an increase in the size of the acoustic wave device. The conductive portion 116, which is flat or substantially flat, is provided away from the functional element 12 in the normal or substantially normal direction. Due to this layout in particular, electromagnetic waves propagating in directions that define angles with the direction normal or substantially normal fan out radially, and the increase in the size of the acoustic wave device may thus be more significant.

As a workaround, the conductive portion 16 is provided between the curved portion 142 and the protection layer 15 and extends along the surface of the curved portion 142. According to the conductive portion 16, the acoustic wave device 10A provides excellent shielding against electromagnetic waves. The conductive portion 16 extends along the surface of the curved portion 142. Accordingly, efficient shielding against electromagnetic waves propagating in directions that define angles with the direction normal or substantially normal to the substrate 11 is also provided without an increase in the size of the conductive portion 16. The increase in the size of the acoustic wave device may be significantly reduced or prevented accordingly.

The conductive portion 16 preferably, for example, does not overlap the wiring 13 when viewed in the direction normal or substantially normal to the substrate 11 (when viewed in plan). A reduction in the parasitic capacitance between the conductive portion 16 and the wiring 13 is provided, and degradation of the characteristics of the acoustic wave device 10A may be significantly reduced or prevented accordingly.

The conductive portion 16 may be grounded or ungrounded. When being ungrounded, the conductive portion 16 defines and functions as a floating electrode. The conductive portion 16 defining and functioning as a floating electrode provides a reduction in the parasitic capacitance between the conductive portion 16 and the wiring 13. Degradation of the characteristics of the acoustic wave device 10A including the conductive portion 16 may be significantly reduced or prevented accordingly.

Modification 1

The conductive portion 16 shown in FIGS. 1 and 2 has a solid pattern. Alternatively, the conductive portion 16 may have a mesh pattern. Accordingly, a reduction in the parasitic capacitance arising from the conductive portion 16 is provided.

Figure 4:
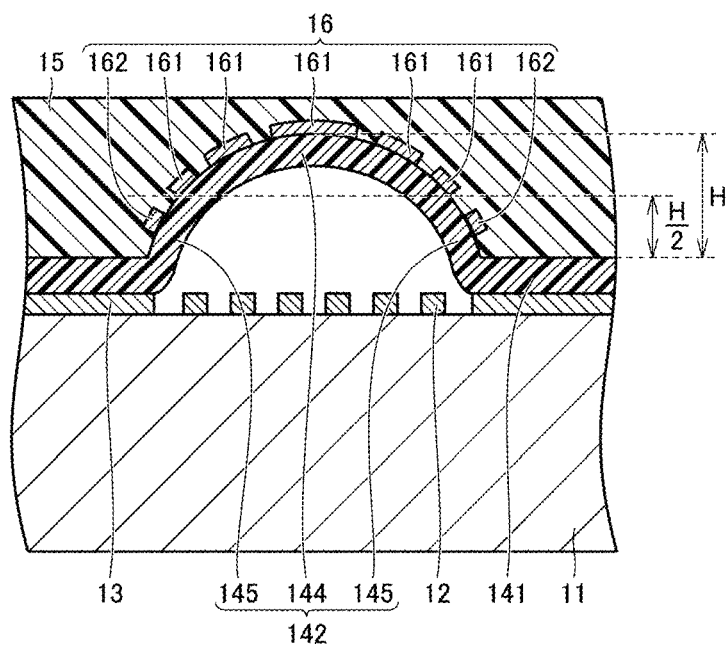
FIG. 4 is a sectional view of an acoustic wave device according to Modification 1 of a preferred embodiment of the present invention.

FIG. 4 is a sectional view of an acoustic wave device according to Modification 1 of a preferred embodiment of the present invention. As shown in FIG. 4, the acoustic wave device includes the conductive portion 16 provided in a meshed shape. A portion of the conductive portion 16 adjacent to or in a vicinity of the boundary portion 143, which is the boundary between the curved portion 142 and the flat or substantially flat portion 141, is adjacent to or in a vicinity of to the wiring 13. As a result, greater parasitic capacitance may be provided between the conductive portion 16 and the wiring 13. Thus, in the case where the conductive portion 16 is provided in a meshed shape, a portion of the conductive portion 16 closer to the wiring 13 preferably has an areal density smaller than the areal density of a portion of the conductive portion 16 farther from the wiring 13, for example.

The curved portion 142 includes a lower curved portion 145, the height of which above the flat or substantially flat portion 141 is preferably less than about H/2, for example, and an upper curved portion 144, the height of which above the flat or substantially flat portion 141 is preferably greater than about H/2, for example, where H denotes the height of the curved portion 142 at a point farther than any other point of the curved portion 142 from the flat or substantially flat portion 141. The conductive portion 16 includes a lower conductive portion 162, which is provided between the lower curved portion 145 and the protection layer 15, and an upper conductive portion 161, which is provided between the upper curved portion 144 and the protection layer 15. The areal density of the lower conductive portion 162 is preferably smaller than the areal density of the upper conductive portion 161, for example. The areal density of the lower conductive portion 162 refers to the proportion of the area of a region of the lower curved portion 145 having the lower conductive portion 162 provided thereon to the area of a region being a surface of the lower curved portion 145 and facing the protection layer 15. The areal density of the upper conductive portion 161 refers to the proportion of the area of a region of the upper curved portion 144 having the upper conductive portion 161 provided thereon to the area of a region being a surface of the upper curved portion 144 and facing the protection layer 15.

The areal density of the lower conductive portion 162, namely, a portion closer to the wiring 13 is preferably smaller than the areal density of the upper conductive portion 161, namely, a portion farther from the wiring 13, for example. Accordingly, a reduction in the parasitic capacitance between the conductive portion 16 and the wiring 13 is provided. Degradation of the characteristics of the acoustic wave device including the conductive portion 16 may be significantly reduced or prevented accordingly. The parasitic capacitance is able to be easily regulated by adjustments to the areal density of the lower conductive portion 162.

Modification 2

Figure 5:
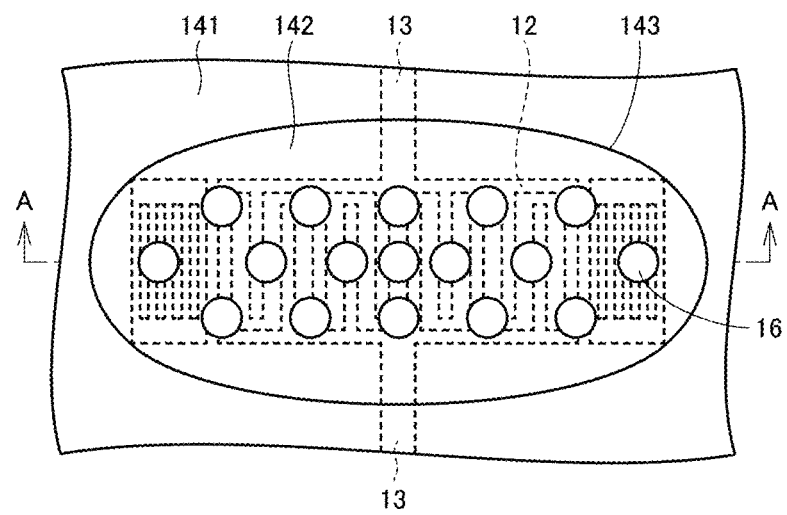
FIG. 5 is an enlarged plan view of a region including a functional element of an acoustic wave device according to Modification 2 of a preferred embodiment of the present invention.
Figure 6:
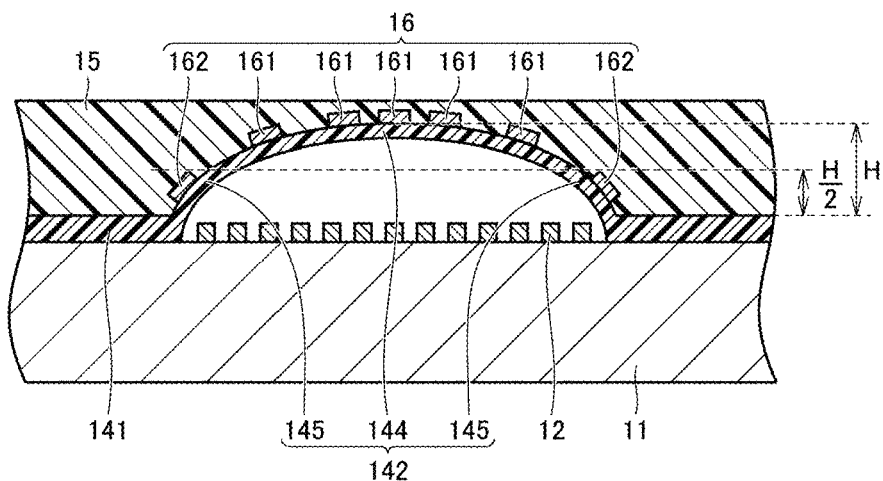
FIG. 6 is a sectional view of the region taken along line A-A in FIG. 5.

FIG. 5 is an enlarged plan view of a region including a functional element of an acoustic wave device according to Modification 2 of a preferred embodiment of the present invention. For greater clarity of the positional relationship between the conductive portion 16 and the functional element 12, the protection layer 15 is omitted from FIG. 5. FIG. 6 is a sectional view of the region taken along line A-A in FIG. 5.

As shown in FIGS. 5 and 6, the conductive portion 16 of the acoustic wave device according to Modification 2 has a pattern including a plurality of dots. Regions farther from the boundary portion 143 and closer to the center of the curved portion 142 viewed in plan have higher dot densities. That is, a region closer to the center of the curved portion 142 viewed in plan includes dots provided with a smaller pitch, and a region closer to the boundary portion 143 includes dots provided with a greater pitch. Thus, the areal density of the lower conductive portion 162 provided between the lower curved portion 145 and the protection layer 15 is smaller than the areal density of the upper conductive portion 161 provided between the upper curved portion 144 and the protection layer 15. That is, the areal density of the lower conductive portion 162, namely, a portion closer to the wiring 13 is preferably smaller than the areal density of the upper conductive portion 161, namely, a portion farther from the wiring 13, for example. The parasitic capacitance between the conductive portion 16 and the wiring 13 may be reduced accordingly. The parasitic capacitance is able to be easily regulated by adjustments to the areal density of the lower conductive portion 162.

Modification 3

Figure 7:
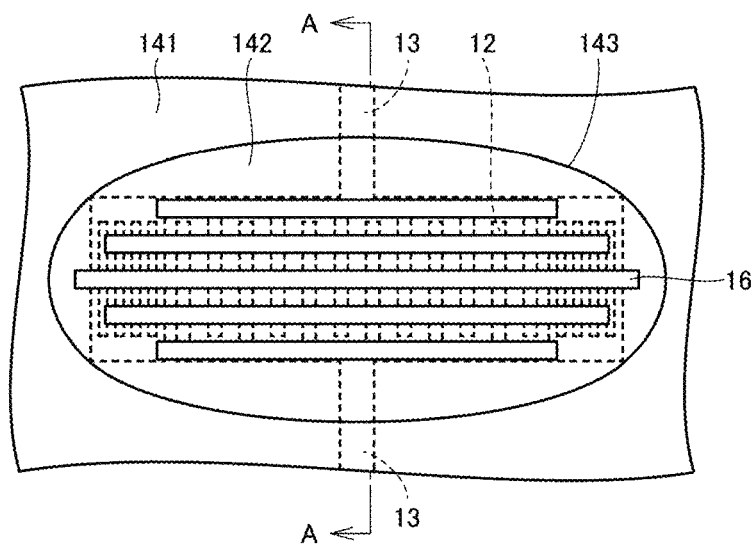
FIG. 7 is an enlarged plan view of a region including a functional element of an acoustic wave device according to Modification 3 of a preferred embodiment of the present invention.
Figure 8:
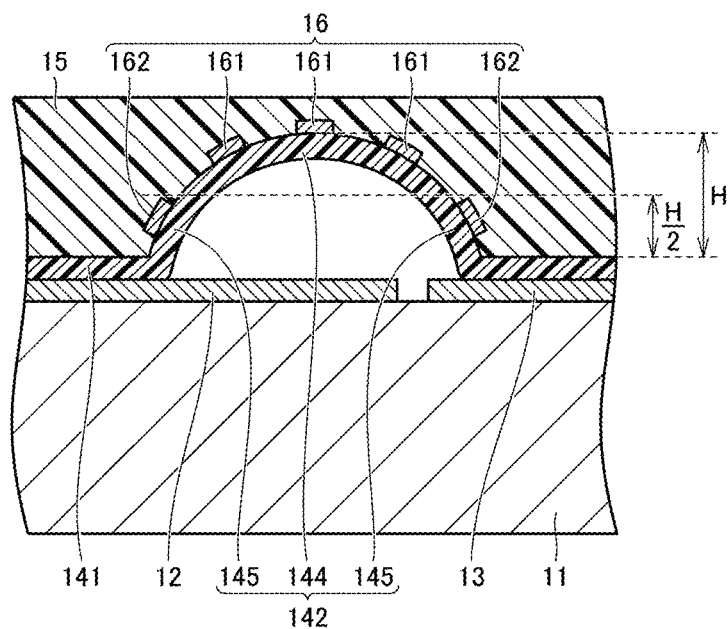
FIG. 8 is a sectional view of the region taken along line A-A in FIG. 7.

FIG. 7 is an enlarged plan view of a region including a functional element of an acoustic wave device according to Modification 3 of a preferred embodiment of the present invention. For greater clarity of the positional relationship between the conductive portion 16 and the functional element 12, the protection layer 15 is omitted from FIG. 7. FIG. 8 is a sectional view of the region taken along line A-A in FIG. 7.

As shown in FIGS. 7 and 8, the conductive portion 16 of the acoustic wave device according to Modification 3 has a pattern including a plurality of strips. The longitudinal direction of the strips is orthogonal or substantially orthogonal to IDT electrodes included the functional element 12. Of the strips, a strip closer to the center of the curved portion 142 viewed in plan is longer. Furthermore, a region closer to the center of the curved portion 142 viewed in plan may include slots provided with a smaller pitch, and a region closer to the boundary portion 143 may include slots provided with a greater pitch. Thus, the areal density of the lower conductive portion 162 provided between the lower curved portion 145 and the protection layer 15 is smaller than the areal density of the upper conductive portion 161 provided between the upper curved portion 144 and the protection layer 15. That is, the areal density of the lower conductive portion 162, namely, a portion closer to the wiring 13 is preferably smaller than the areal density of the upper conductive portion 161, namely, a portion farther from the wiring 13, for example. The parasitic capacitance between the conductive portion 16 and the wiring 13 may be reduced accordingly. The parasitic capacitance is able to be easily regulated by adjustments to the areal density of the lower conductive portion 162.

Modification 4

Figure 9:
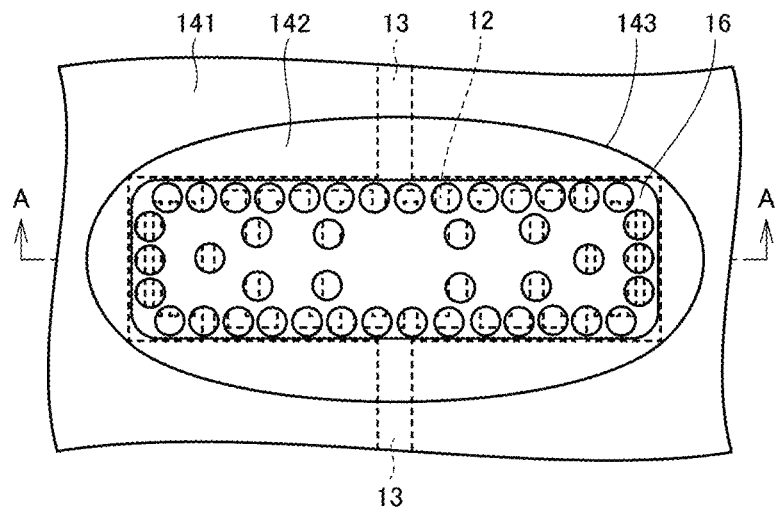
FIG. 9 is an enlarged plan view of a region including a functional element of an acoustic wave device according to Modification 4 of a preferred embodiment of the present invention.
Figure 10:
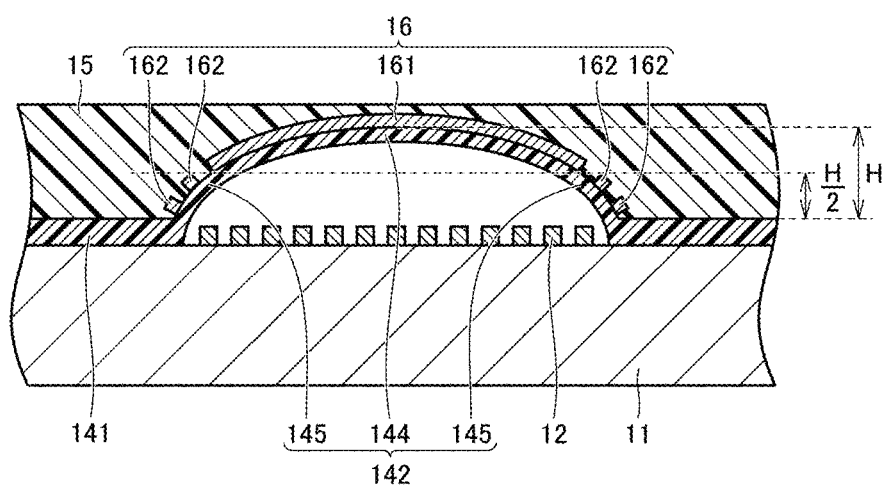
FIG. 10 is a sectional view of the region taken along line A-A in FIG. 9.

FIG. 9 is an enlarged plan view of a region including a functional element of an acoustic wave device according to Modification 4 of a preferred embodiment. For greater clarity of the positional relationship between the conductive portion 16 and the functional element 12, the protection layer 15 and the cover layer 14 except for the boundary portion 143 are omitted from FIG. 9. FIG. 10 is a sectional view of the region taken along line A-A in FIG. 9.

As shown in FIGS. 9 and 10, the conductive portion 16 of the acoustic wave device according to Modification 4 has a pattern having a plurality of dot-shaped holes. Regions farther from the center of the curved portion 142 viewed in plan and closer to the boundary portion 143 have higher hole densities. That is, a region closer to the center of the curved portion 142 viewed in plan includes dot-shaped holes provided with a greater pitch, and a region closer to the boundary portion 143 includes dot-shaped holes provided with a smaller pitch. Thus, the areal density of the lower conductive portion 162 provided between the lower curved portion 145 and the protection layer 15 is smaller than the areal density of the upper conductive portion 161 provided between the upper curved portion 144 and the protection layer 15. That is, the areal density of the lower conductive portion 162, namely, a portion closer to the wiring 13 is preferably smaller than the areal density of the upper conductive portion 161, namely, a portion farther from the wiring 13, for example. The parasitic capacitance between the conductive portion 16 and the wiring 13 may be reduced accordingly. The parasitic capacitance is able to be easily regulated by adjustments to the areal density of the lower conductive portion 162.

Modification 5

In the example shown in FIGS. 1 and 2, the conductive portion 16 is located above only the functional element 12 that is located in the center of the acoustic wave device 10A and overlaps the functional element 12 in the center of the acoustic wave device 10B when viewed in the direction normal or substantially normal to the substrate 11. The conductive portion 16 is provided between the protection layer 15 and the curved portion 142 that covers at least one of the functional elements 12 included in the acoustic wave device 10A or 10B to provide shielding against electromagnetic waves.

For example, the conductive portion 16 may be provided between the protection layer 15 and the curved portion 142 that covers the functional element 12 located in the center or approximate center of the acoustic wave device 10B and overlapping the functional element 12 in the center of the acoustic wave device 10A when viewed in the direction normal or substantially normal to the substrate 11. Alternatively, the conductive portion 16 may be provided between the protection layer 15 and each of the curved portions 142 respectively covering the functional element 12 in the center or approximate center of the acoustic wave device 10A and the functional element 12 in the center or approximate center of the acoustic wave device 10B that overlap each other when viewed in the direction normal or substantially normal to the substrate 11.

Electromagnetic waves radiated by the functional elements 12 propagate radially. With this being the situation, the conductive portion 16 may be provided between the protection layer 15 and the curved portion 142 that covers at least one of two functional elements 12 included in the acoustic wave device 10A or 10B and provided in a direction that defines an angle with the direction normal or substantially normal to the substrate 11. Alternatively, the conductive portion 16 may be provided between the protection layer 15 and the curved portion 142 that covers all the functional elements 12.

Modification 6

The functional element 12 of the acoustic wave device 10A or 10B described above includes IDT electrodes. Alternatively, the functional element 12 of the acoustic wave device 10A or 10B may include a bulk wave resonator in which a piezoelectric thin film is provided on a substrate including, for example, silicon (Si).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
    a substrate;
    a functional element provided on the substrate;
    a cover layer provided on or above the substrate to cover the functional element; and
    a protection layer that covers the cover layer; wherein
    the cover layer includes a curved portion that is curved to protrude outward and a flat or substantially flat portion extending along the substrate;
    a hollow space is defined between the curved portion and the substrate;
    the functional element is provided in the hollow space;
    a conductive portion is provided between the curved portion and the protection layer and extends along a surface of the curved portion;
    the curved portion includes:
        a lower curved portion whose height above the flat or substantially flat portion is less than about H/2, where H denotes a height of the curved portion at a point farther than any other point of the curved portion from the flat or substantially flat portion; and
        an upper curved portion whose height above the flat or substantially flat portion is greater than about H/2;
    the conductive portion includes a lower conductive portion provided between the lower curved portion and the protection layer and an upper conductive portion provided between the upper curved portion and the protection layer; and
    the lower conductive portion has an areal density lower than an areal density of the upper conductive portion.

2. The acoustic wave device according to claim 1, further comprising:
    a wiring that is provided on the substrate and is connected to the functional element; wherein
    the conductive portion does not overlap the wiring when viewed in a direction normal or substantially normal to the substrate.

3. The acoustic wave device according to claim 2, wherein the wiring is exposed at through-holes provided in the cover layer and the protection layer.

4. The acoustic wave device according to claim 1, wherein the conductive portion has a mesh pattern, a pattern including a plurality of dots, a pattern including a plurality of strips, or a pattern including a plurality of dot-shaped holes.

5. The acoustic wave device according to claim 1, wherein the conductive portion is ungrounded.

6. The acoustic wave device according to claim 1, wherein the functional element is an interdigital transducer (IDT) electrode.

7. The acoustic wave device according to claim 1, wherein the functional element includes a pair of interdigital transducer (IDT) electrodes that define a surface acoustic wave resonator.

8. The acoustic wave device according to claim 1, wherein the cover layer is a resin film or an inorganic membrane.

9. An acoustic wave module, comprising:
    the acoustic wave device according to claim 1; and
    a second acoustic wave device, wherein
    the acoustic wave device and the second acoustic wave device overlap in the direction normal or substantially normal to the substrate.

10. The acoustic wave module according to claim 9, wherein the functional element of the acoustic wave device and a functional element of the second acoustic wave device overlap in the direction normal or substantially normal to the substrate.

11. The acoustic wave device according to claim 1, wherein the conductive portion has a solid pattern.

12. The acoustic wave device according to claim 1, wherein the conductive portion is grounded.

13. The acoustic wave device according to claim 1, wherein the conductive portion overlaps the functional element when viewed in the direction normal or substantially normal to the substrate.

14. An acoustic wave module comprising:
    a first acoustic wave device; and
    a second acoustic wave device; wherein
    each of the first and second acoustic wave devices includes:
        a substrate;
        a functional element provided on the substrate;
        a cover layer provided on or above the substrate to cover the functional element; and
        a protection layer that covers the cover layer;
    the cover layer of each of the first and second acoustic wave devices includes a curved portion that is curved to protrude outward and a flat or substantially flat portion extending along the substrate;

a hollow space is defined between the curved portion and the substrate in each of the first and second acoustic wave devices;
the functional element is provided in the hollow space of each of the first and second acoustic wave devices;
the first acoustic wave device overlaps the second acoustic wave device in a direction normal or substantially normal to the substrate;
a conductive portion is provided between the protection layer and at least one of the curved portion of the first acoustic wave device and the curved portion of the second acoustic wave device and extends along a surface of the curved portion;
the curved portion which the conductive portion extends along the surface of includes:
  a lower curved portion whose height above the flat or substantially flat portion is less than about H/2, where H denotes a height of the curved portion at a point farther than any other point of the curved portion from the flat or substantially flat portion; and
  an upper curved portion whose height above the flat or substantially flat portion is greater than about H/2;
the conductive portion includes a lower conductive portion provided between the lower curved portion and the protection layer and an upper conductive portion provided between the upper curved portion and the protection layer; and
the lower conductive portion has an areal density lower than an areal density of the upper conductive portion.

* * * * *